(12) United States Patent
Cheng et al.

(10) Patent No.: US 12,238,479 B2
(45) Date of Patent: Feb. 25, 2025

(54) MEMS SPEAKER AND MANUFACTURING METHOD FOR SAME

(71) Applicant: AAC Kaitai Technologies (Wuhan) CO., LTD, Hubei (CN)

(72) Inventors: Shiyang Cheng, Shenzhen (CN); Yiwei Zhou, Shenzhen (CN); Qiang Dan, Shenzhen (CN); Yang Li, Shenzhen (CN)

(73) Assignee: AAC Kaitai Technologies (Wuhan) CO., LTD, Wuhan (CN)

( * ) Notice: Subject to any disclaimer, the term of this patent is extended or adjusted under 35 U.S.C. 154(b) by 508 days.

(21) Appl. No.: 17/566,635

(22) Filed: Dec. 30, 2021

(65) Prior Publication Data

US 2023/0007406 A1 Jan. 5, 2023

(30) Foreign Application Priority Data

Jul. 5, 2021 (CN) .......................... 202110758271.3

(51) Int. Cl.
*H04R 19/00* (2006.01)
*B81B 3/00* (2006.01)

(52) U.S. Cl.
CPC ......... *H04R 19/005* (2013.01); *B81B 3/0059* (2013.01); *B81B 2201/0257* (2013.01); *B81B 2203/0127* (2013.01); *H04R 2201/003* (2013.01)

(58) Field of Classification Search
CPC ............ H04R 19/005; H04R 2201/003; B81B 3/0059; B81B 2201/0257; B81B 2203/0127
See application file for complete search history.

(56) References Cited

U.S. PATENT DOCUMENTS

2018/0186622 A1* 7/2018 Mögelin ............... B81B 3/0045
2020/0100033 A1* 3/2020 Stoppel ................ H04R 31/003

FOREIGN PATENT DOCUMENTS

CN 111405445 A * 7/2020
CN 112543408 A * 3/2021 ........... B81B 3/0021

OTHER PUBLICATIONS

English machine translation of CN-111405445-A (Liu Duan; MEMS structure; published Jul. 2020) (Year: 2020).*
English machine translation of CN-112543408-A (Liu et al.; Closed vibrating diaphragm piezoelectric MEMS loudspeaker and preparation method thereof; published Mar. 2021) (Year: 2021).*

* cited by examiner

*Primary Examiner* — Mark Fischer
(74) *Attorney, Agent, or Firm* — W&G Law Group

(57) ABSTRACT

The present invention provides a MEMS speaker including a substrate sidewall enclosing a cavity. The substrate sidewall includes a first surface and a second surface, a sounding assembly that is arranged on the first surface of the substrate sidewall and also seals the cavity at the opening of the first surface, and a bracket disposed in the cavity. The sounding assembly includes a first sounding assembly and the second sounding assembly. Each sounding assembly includes a driving part and a flexible diaphragm. The flexible diaphragm closes the gap formed between the free ends of adjacent driving parts and between the free ends of the driving parts and the substrate sidewall. The present invention also provides a manufacturing method of MEMS speaker. The MEMS speakers provided by the present invention have high-quality acoustic performance.

5 Claims, 9 Drawing Sheets

MEMS SPEAKER AND MANUFACTURING METHOD FOR SAME

FIELD OF THE PRESENT DISCLOSURE

The present invention relates to electromechanical transducers, and more particularly to a MEMS speaker and a method for manufacturing the MEMS speaker.

DESCRIPTION OF RELATED ART

For MEMS speaker of related technology, the air gap in the free end of the driver can cause sound leakage. Even if a baffle is added to the opposite side of the free end, acoustic leakage still exists. At this time, the inverted sound waves on the upper and lower surfaces of the sound emitting structure will cause an acoustic short circuit, which will cause a serious decrease in the sound pressure output.

Therefore, it is necessary to provide a new MEMS speaker to solve the above technical problems.

SUMMARY OF THE PRESENT INVENTION

One of the main objects of the present invention is to provide a MEMS acoustic sensor which is able to avoid acoustic short circuit.

To achieve the above-mentioned objects, the present invention provides a MEMS speaker, including: a substrate sidewall including a first surface and a second surface that are set opposite to each other; a cavity surrounded by the substrate sidewall; a ring bracket accommodated in the cavity; a sounding assembly locating on the first surface of the substrate sidewall and sealing an opening of the cavity on the first surface, including a first sounding assembly locating between the substrate sidewall and the ring bracket, and a second sounding assembly inside the ring bracket. The first sounding assembly includes a plurality of first driving parts each having a first fixed end fixed to the ring bracket, and a first free end connected to the first fixed end and extending in a direction close to the substrate sidewall.

A first gap is formed between the first free end and the substrate sidewall; and a second gap is formed between the first free ends of two adjacent first driving parts. The first sounding assembly further includes a first flexible diaphragm connecting the substrate sidewall and the first free end and sealing the first gap, a second flexible diaphragm connecting the first free ends of the two adjacent first driving parts and sealing the second gap.

The second sounding assembly includes a plurality of second driving parts each having a second fixed end fixed to the ring bracket, and a second free end connected to the second fixed end extending away from the substrate sidewall. A third gap is formed between the second free ends of two adjacent second driving parts. The second sounding assembly further includes a third flexible diaphragm connecting second free ends of two adjacent second driving parts and sealing the third gap.

In addition, the first flexible diaphragm and the second flexible diaphragm are integrated formed.

In addition, a shape of the first flexible diaphragm and/or the second flexible diaphragm and/or the third flexible diaphragm includes plane, arch, trapezoid, square, and polyline shapes.

In addition, the MEMS speaker further comprises a connection wall in the cavity for connecting the substrate sidewall and the ring bracket; the connection wall is aligned with the second gap.

In addition, a stiffness of the first driving part is greater than a stiffness of the first flexible diaphragm; the stiffness of the first driving part is greater than a stiffness of the second flexible diaphragm; the stiffness of the second driving part is greater than a stiffness of the third flexible diaphragm.

In addition, the first driving part and/or the second driving part include a cantilever beam and a piezoelectric driver attached to the cantilever beam.

From another aspect, the invention further provides a MEMS speaker including: a substrate sidewall enclosing a cavity; including a first surface and a second surface opposite to each other; a sounding assembly arranged on the first surface of the substrate sidewall and sealing an opening of the cavity on the first surface; a bracket arranged in the cavity and connected to the substrate sidewall. The substrate sidewall includes a first sidewall section located on one side of the bracket, and a second sidewall section located on the other side of the bracket.

The sounding assembly includes a first sounding assembly located on one side of the bracket, and a second sounding assembly located on the other side of the bracket. The first sounding assembly includes a first driving part each having a first fixed end fixed to the bracket, and a first free end connected to the first fixed end and extending in a direction away from the bracket.

A first gap is formed between the first free end and the first sidewall section. The first sounding assembly further includes a first flexible diaphragm that connects the first sidewall section and the first free end and sealing the first gap. The second sounding assembly includes a second driving part having a second fixed end fixed to the bracket and a second free end connected to the second fixed end and extending in a direction away from the bracket. A second gap is formed between the second free end and the second sidewall section. The second sounding assembly further includes a second flexible diaphragm connecting the second sidewall section and the second free end and sealing the second gap.

In addition, the first flexible diaphragm and the second flexible diaphragm are integrally formed.

In addition, a shape of the first flexible diaphragm and/or the second flexible diaphragm includes at least one of a flat shape, an arch shape, a trapezoid shape, a square shape, and a broken line shape.

In addition, a stiffness of the first driving part is greater than a stiffness of the first flexible diaphragm; a stiffness of the second driving part is greater than a stiffness of the second flexible diaphragm.

In addition, the first driving part and/or the second driving part include a cantilever beam and a piezoelectric driver attached to the cantilever beam.

From another aspect, the invention further provides a method for manufacturing a MEMS speaker including steps of:

providing a SOI (Silicon-On-Insulator) wafer including a first silicon layer, a silicon oxide layer, and a second silicon layer that are sequentially stacked;

depositing a first electrode layer on the second silicon layer;

depositing a piezoelectric material layer on the first electrode layer;

depositing a second electrode layer on the piezoelectric material layer;

etching the second electrode layer, the piezoelectric material layer and the first electrode layer for forming a piezoelectric driver structure;

etching the second silicon layer for forming a structural layer having a cantilever beam structure corresponding to the piezoelectric driver structure one-to-one;

deposit an flexible diaphragm on the structural layer and the piezoelectric driver structure;

etching the flexible diaphragm for forming an flexible diaphragm;

etching the first silicon layer for forming a substrate sidewall surrounding a cavity and a bracket located in the cavity;

releasing the silicon oxide layer.

The invention further provides a method for manufacturing a MEMS speaker including steps of:

providing a SOI wafer including a first silicon layer, a silicon oxide layer, and a second silicon layer that are sequentially stacked;

depositing a first electrode layer on the second silicon layer;

depositing a piezoelectric material layer on the first electrode layer;

depositing a second electrode layer on the piezoelectric material layer;

etching the second electrode layer, the piezoelectric material layer and the first electrode layer for forming a structure layer having a cantilever beam structure corresponding to the piezoelectric driver structure;

depositing a sacrificial layer on the structural layer and the piezoelectric driver structure;

etching the sacrificial layer and shaping the remaining sacrificial layer for forming the subsequently formed flexible diaphragm;

deposit an flexible diaphragm on the structural layer, the piezoelectric driver structure and the remaining sacrificial layer;

etching the flexible diaphragm to form an flexible diaphragm;

etching the first silicon layer to form a substrate sidewall surrounding a cavity and a bracket located in the cavity;

releasing the silicon oxide layer and the remaining sacrificial layer.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

Figure 1:
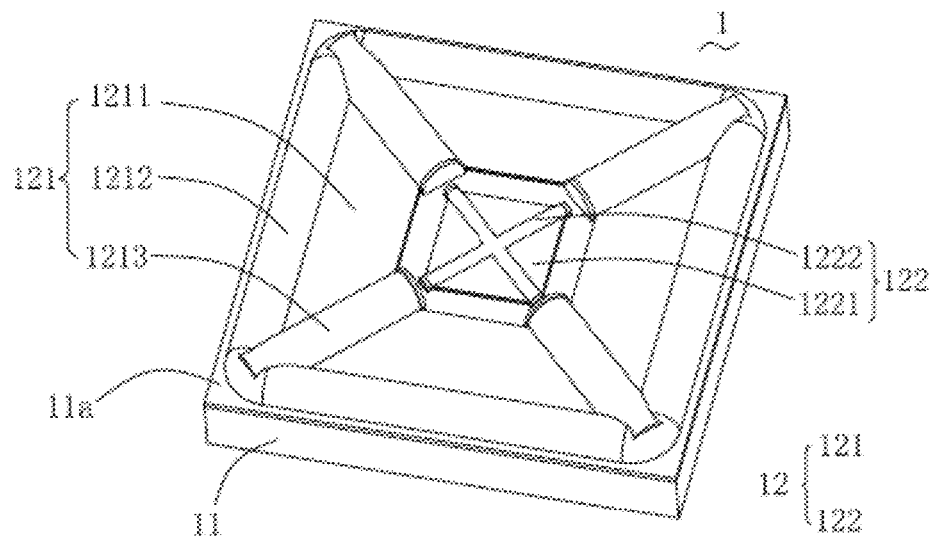
FIG. 1 is an isometric view of a MEMS speaker in accordance with a first embodiment provided by the present invention.
Figure 2:
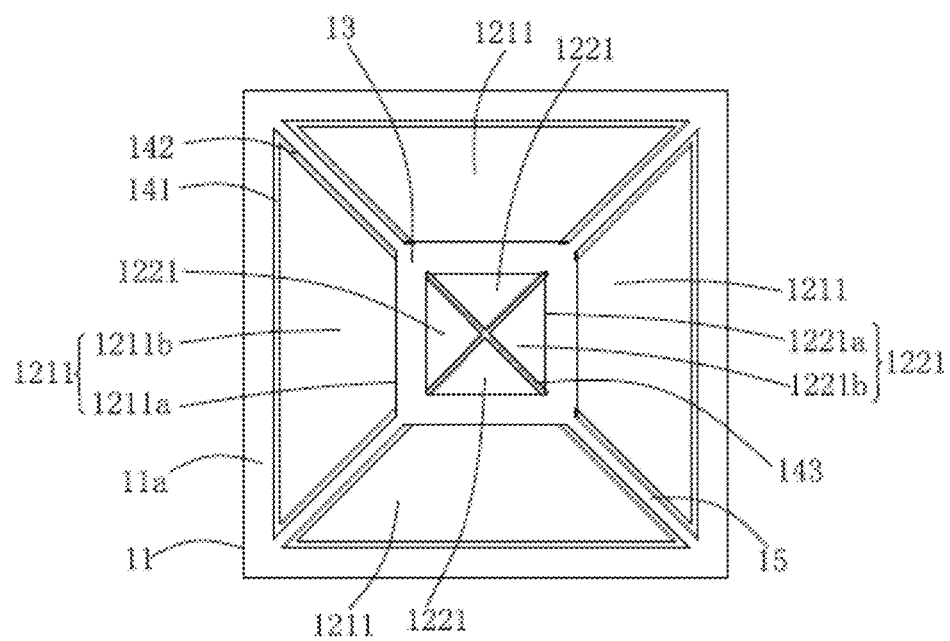
FIG. 2 is a front view of the MEMS speaker with a first flexible diaphragm, a second flexible diaphragm and a third flexible diaphragm removed.
Figure 3:
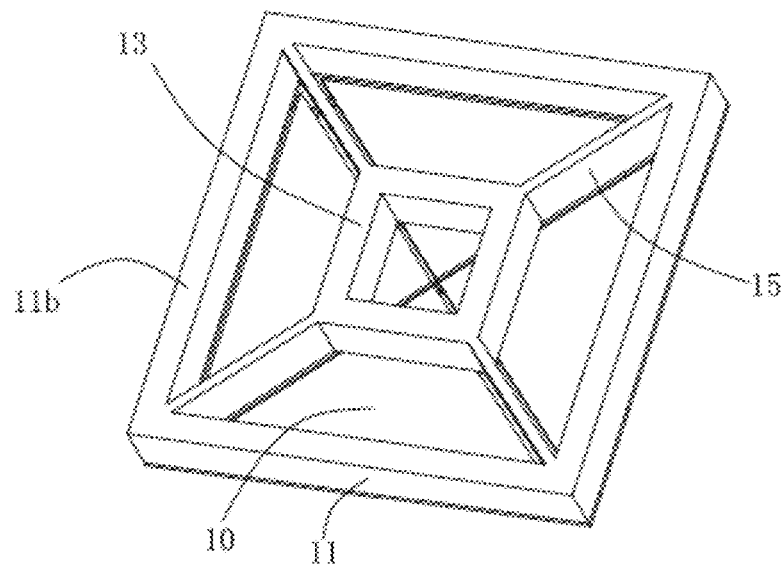
FIG. 3 is an isometric view of the MEMS speaker of the first embodiment, from another perspective.
Figure 4:
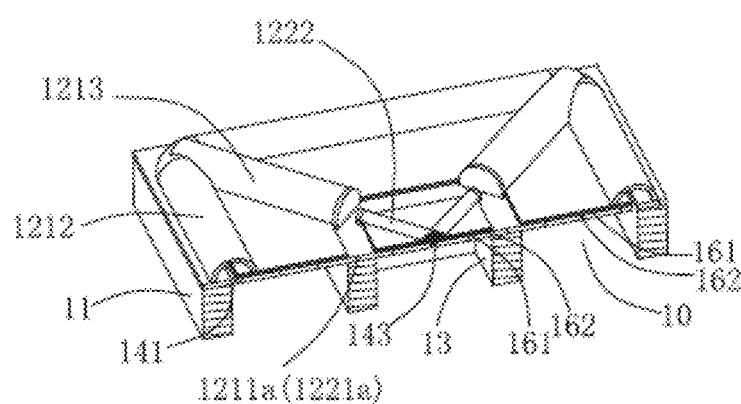
FIG. 4 is a cross-sectional view of the MEMS speaker.
Figure 5:
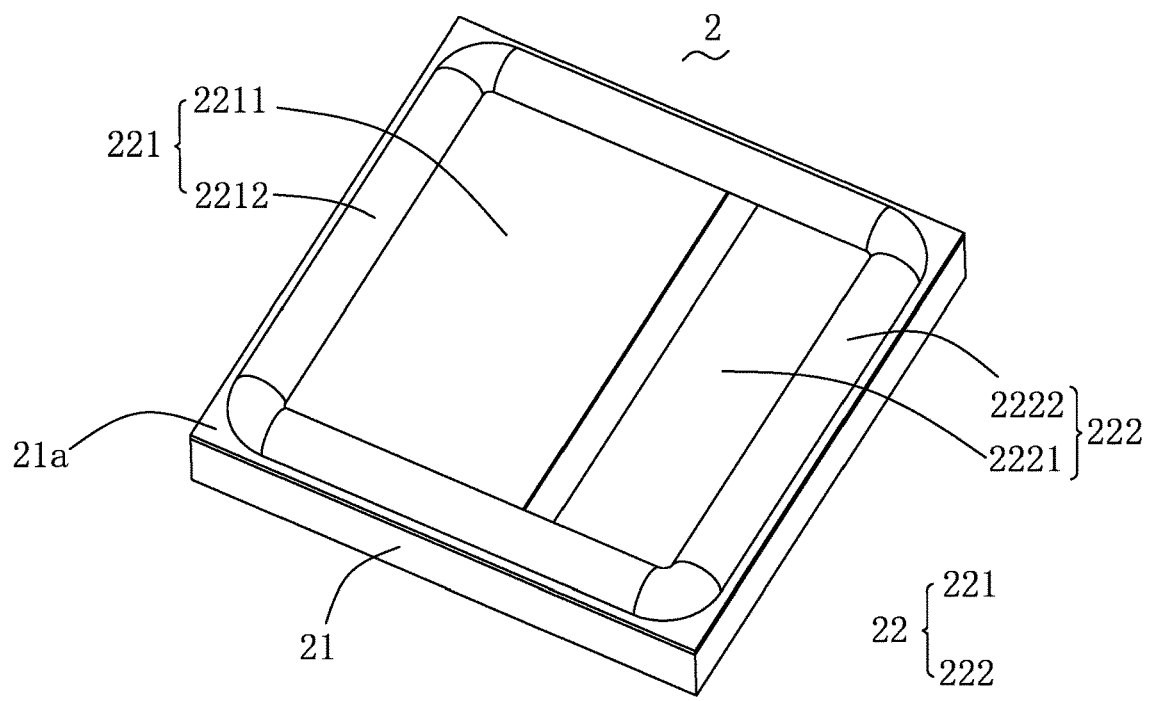
FIG. 5 is an isometric view of a MEMS speaker in accordance with a second embodiment provided by the present invention.
Figure 6:
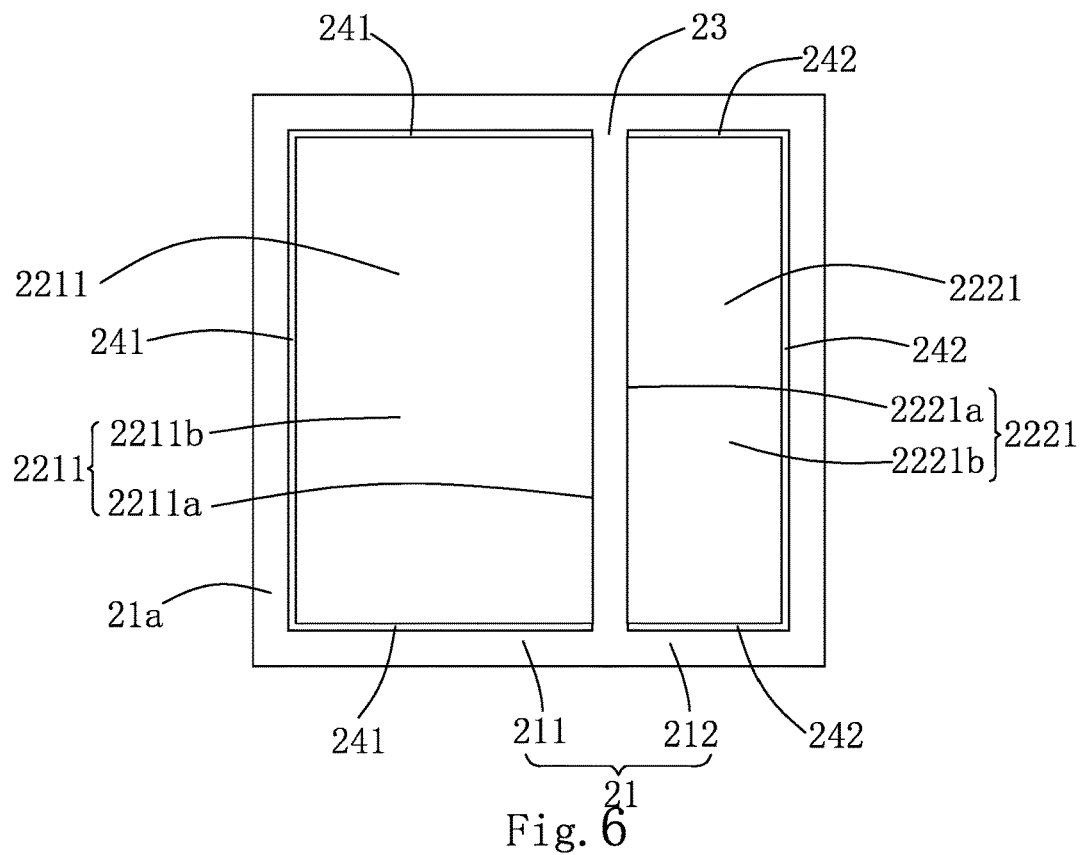
FIG. 6 is a front view of the MEMS speaker in FIG. 5, with a first flexible diaphragm and a second flexible diaphragm removed.
Figure 7:
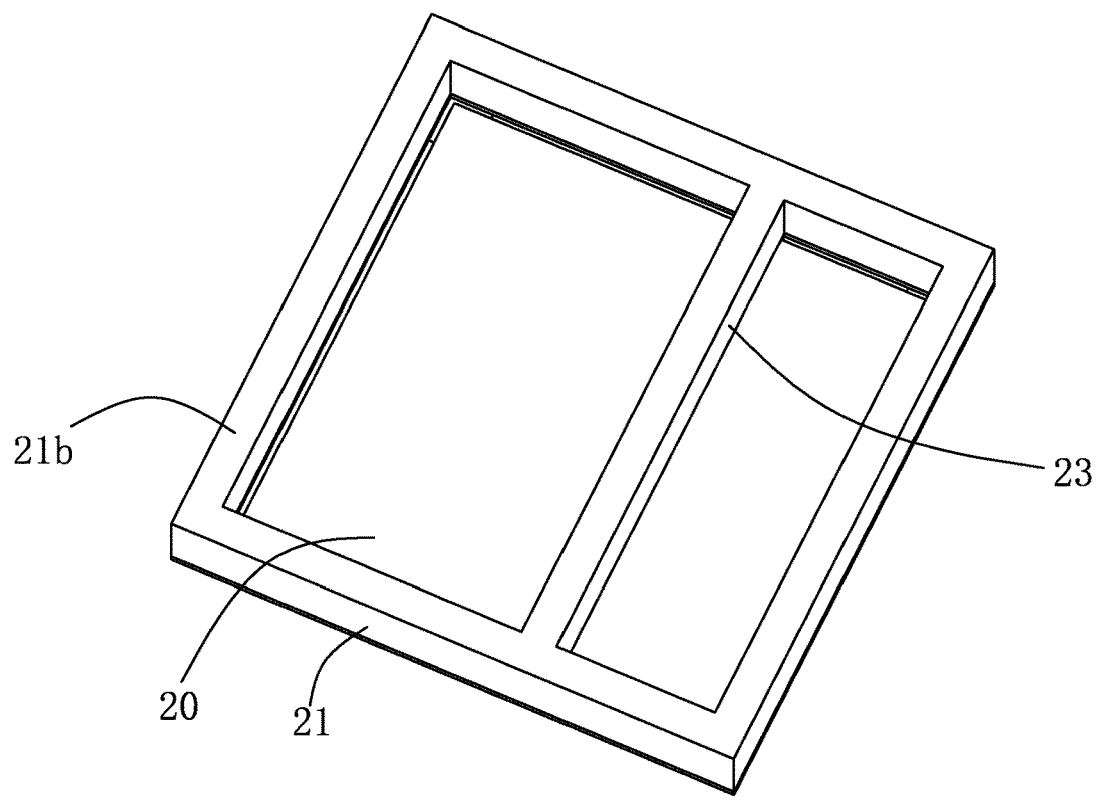
FIG. 7 is an isometric view of the MEMS speaker of the second embodiment, from another perspective.
Figure 8:
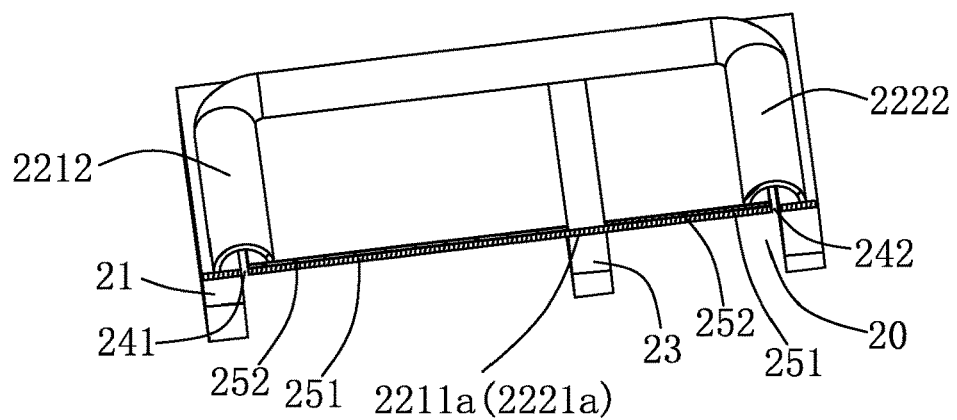
FIG. 8 is a cross-sectional view of the MEMS speaker of the second embodiment.

The present disclosure will hereinafter be described in detail with reference to several exemplary embodiments. To make the technical problems to be solved technical solutions and beneficial effects of the present disclosure more apparent, the present disclosure is described in further detail together with the figures and the embodiments. It should be understood the specific embodiments described hereby are only to explain the disclosure, not intended to limit the disclosure.

As shown in FIGS. 1-4, a MEMS speaker 1 in accordance with a first embodiment provided by the present invention includes a substrate sidewall 11 enclosing a cavity 10. The substrate sidewall 11 includes a first surface 11a and a second surface 11b which are arranged oppositely.

The MEMS speaker 1 further include a sounding assembly 12 arranged on the first surface 11a of the substrate sidewall 11 and sealing the opening of the cavity 10 on the first surface 11a, and a ring bracket 13 arranged in the cavity 10.

The sounding assembly 12 includes a first sounding assembly 121 located between the substrate sidewall 11 and the ring bracket 13, and a second sounding assembly 122 located inside the ring bracket 13.

The first sounding assembly 121 includes a plurality of first driving parts 1211. Each of the first driving parts 1211 includes a first fixed end 1211a fixed to the ring bracket 13, and a first free end 1211b connected to the first fixed end 1211a and extending in a direction close to the substrate sidewall 11. A first gap 141 is arranged between the first free end 1211b and the substrate sidewall 11. A second gap is arranged 142 between the first free ends 1211b of two adjacent first driving parts 1211. The first sounding assembly 121 also includes a first flexible diaphragm 1212 that connects the substrate sidewall 11 and the first free end 1211b and seals the first gap 141, a second flexible diaphragm 1213 that connects the first free ends 1211b of the two adjacent first driving part 1211 and seals the second gap 142. Preferably, the first flexible diaphragm 1212 and the second flexible diaphragm 1213 are integrally arranged.

The second sounding assembly 122 includes a number of second driving parts 1221. Each of the second driving parts 1221 includes a second fixed end 1221a fixed to the ring bracket 13, and a second free end 1221b connected to the second fixed end 1221a and extending away from the substrate sidewall 11. A third gap 143 is arranged between the second free ends 1221b of two adjacent second driving parts 1221. The second sounding assembly 122 further includes a third flexible diaphragm 1222 that connects the second free end 1221b of the two adjacent second driving parts 1221 and seals the third gap 143.

The shapes of the first flexible diaphragm 1212, the second flexible diaphragm 1213, and the third flexible diaphragm 1222 include at least one of a plane shape, an arch shape, a trapezoid shape, a square shape, and a broken line shape.

The MEMS speaker 1 also include a connection wall 15 arranged in the cavity 10 to connect the substrate sidewall 11 and the ring bracket 13. The connection wall 15 is aligned with the second gap 142. Of course, the manner in which the ring bracket 13 is arranged in the cavity 10 is not limited to the above-mentioned form through the connection wall. In other embodiments, the connection wall may not be set. The ring bracket 13 is fixed by an additional component (such as a printed circuit board) so as to be arranged in the cavity 10.

The stiffness of the first driving part 1211 is greater than the stiffness of the first flexible diaphragm 1212. The stiffness of the first driving part 1211 is greater than the stiffness of the second flexible diaphragm 1213. The stiffness of the second driving part 1221 is greater than the stiffness of the third flexible diaphragm 1222.

In this embodiment, the first driving part 1211 and the second driving part 1221 include a cantilever beam 161 and a piezoelectric driver 162 attached to the cantilever beam 161. Of course, the driving method is not limited to the piezoelectric driving method described above, and an electrostatic driving method may also be adopted in other embodiments.

As shown in FIGS. 5-8, a MEMS speaker 2 in accordance with a second embodiment provided by the present invention includes a substrate sidewall 21 enclosing a cavity 20. The substrate sidewall 21 includes a first surface 21a and a second surface 21b that are arranged oppositely.

The MEMS speaker 2 also include a sounding assembly 22 arranged on the first surface 21a of the substrate sidewall 21 and sealing the opening of the cavity 20 on the first surface 21a, and a bracket 23 arranged in the cavity 20 and connected to the substrate sidewall 21.

The substrate sidewall 21 includes a first sidewall section 211 located on one side of the bracket 23 and a second sidewall section 212 located on the other side of the bracket 23.

The sounding assembly 22 includes a first sounding assembly 221 located on one side of the bracket 23 and a second sounding assembly 222 located on the other side of the bracket 23.

The first sounding assembly 221 includes a first driving part 2211. The first driving part 2211 includes a first fixed end 2211a fixed to the bracket 23 and a first free end 2211b connected to the first fixed end 2211a and extending away from the bracket 23. A first gap 241 is arranged between the first free end 2211b and the first sidewall section 211. The first sounding assembly 221 further includes a first flexible diaphragm 2212 connecting the first sidewall section 211 and the first free end 2211b and sealing the first gap 241.

The second sounding assembly 222 includes a second driving part 2221. The second driving part 2221 includes a second fixed end 2221a fixed to the bracket 23 and a second free end 2221b connected to the second fixed end 2221a and extending away from the bracket 23. A second gap 242 is arranged between the second free end 2221b and the second sidewall section 212. The second sounding assembly 222 further includes a second flexible diaphragm 2222 that connects the second sidewall section 212 and the second free end 2221b and seals the second gap 242. Preferably, the first flexible diaphragm 2212 and the second flexible diaphragm 2222 are integrally arranged.

The shapes of the first flexible diaphragm 2212 and the second flexible diaphragm 2222 include at least one of a plane shape, an arch shape, a trapezoid shape, a square shape, and a broken line shape.

The stiffness of the first driving part 2211 is greater than the stiffness of the first flexible diaphragm 2212. The stiffness of the second driving part 2221 is greater than the stiffness of the second flexible diaphragm 2222.

In this embodiment, the first driving part 2211 and the second driving part 2221 include a cantilever beam 251 and a piezoelectric driver 252 attached to the cantilever beam 251. Of course, the driving method is not limited to the piezoelectric driving method described above, and an electrostatic driving method may also be adopted in other embodiments.

The sounding assembly of the MEMS speaker provided by the present invention seals the opening of the cavity on the first surface. Eliminate the sound pressure leakage and the sounds short-circuit effect on the upper and lower surfaces, and maximize the audio output effect. The driving part of the sounding assembly and the flexible diaphragm can ensure both large force transmission and large displacement, so as to achieve a high level of sound pressure output. The first sounding assembly and the second sounding assembly can be responsible for high-frequency signals and low-frequency signals, respectively. After crossover processing, the bass can be made fuller and stronger, and the treble can be clearer and louder. The fixed ends of the driving part of the first sounding assembly and the second sounding assembly are fixed on the bracket. The mutual crosstalk of the cascade structure is avoided, and the harmonic distortion effect is reduced to a minimum.

Figure 9:
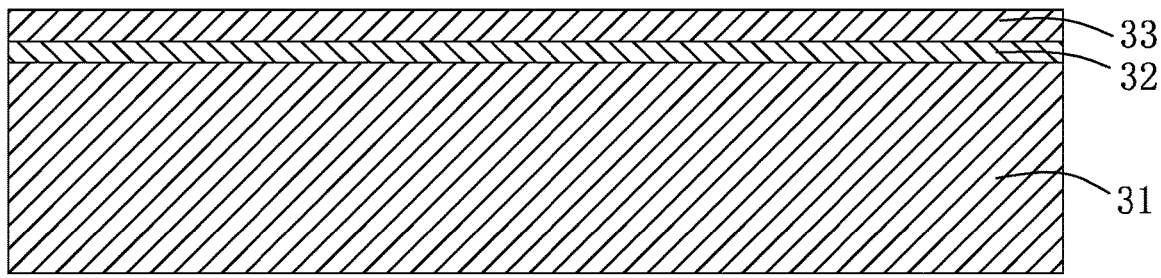
FIGS. 9-20 are flowcharts of a method for manufacturing a MEMS speaker provided by the present invention.
Figure 10:
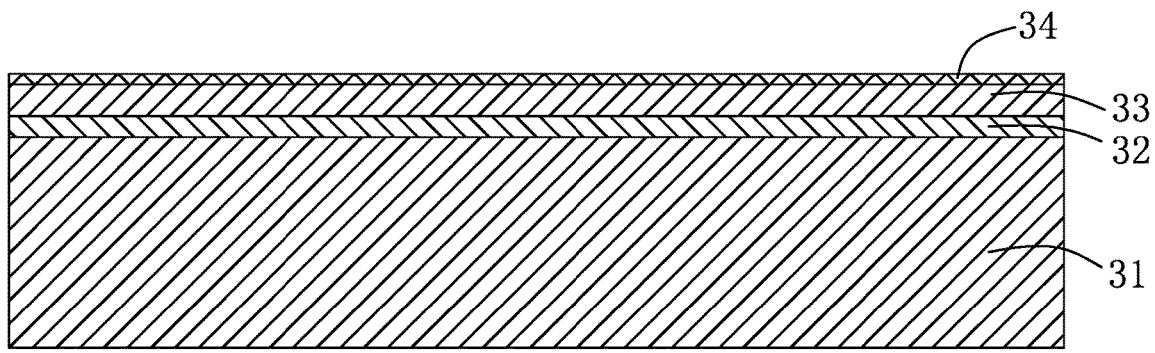
Figure 11:
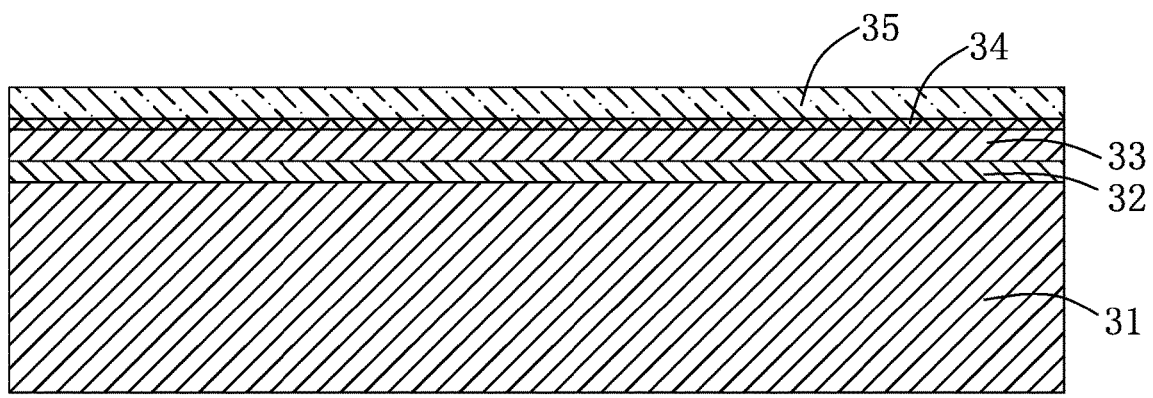
Figure 12:
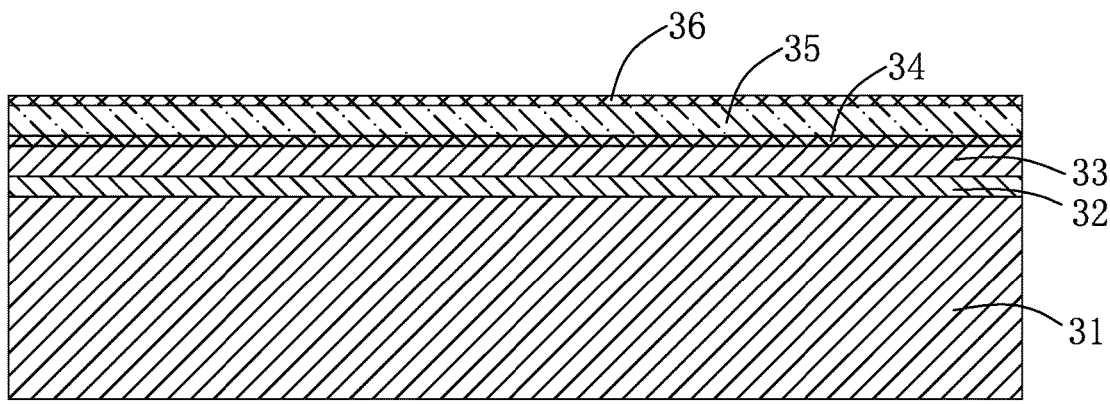
Figure 13:
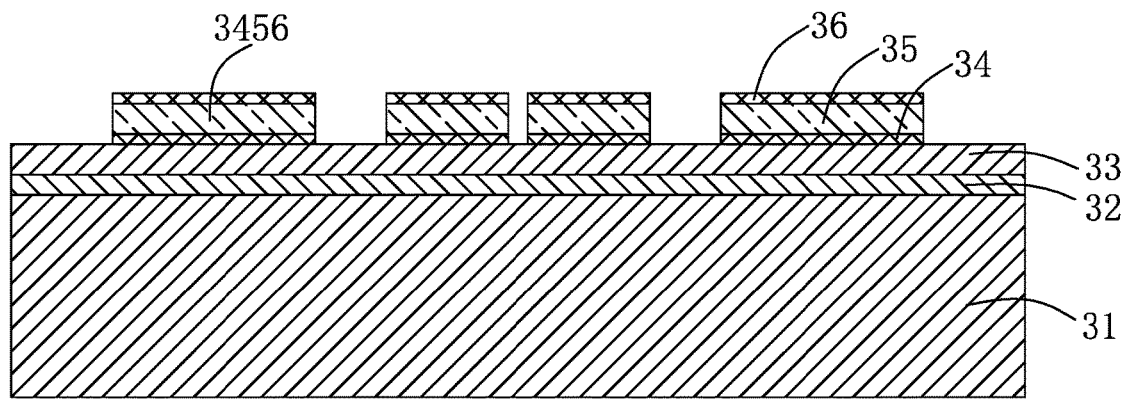
Figure 14:
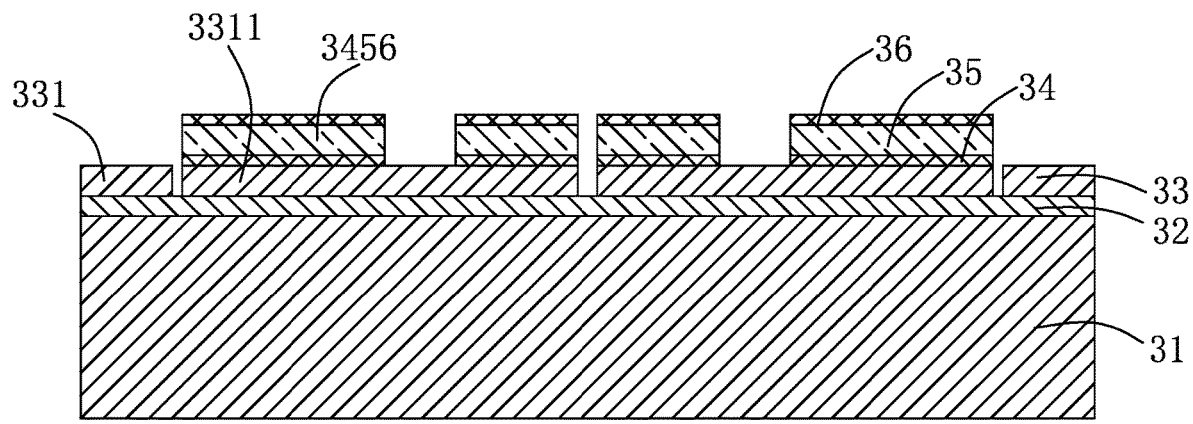
Figure 15:
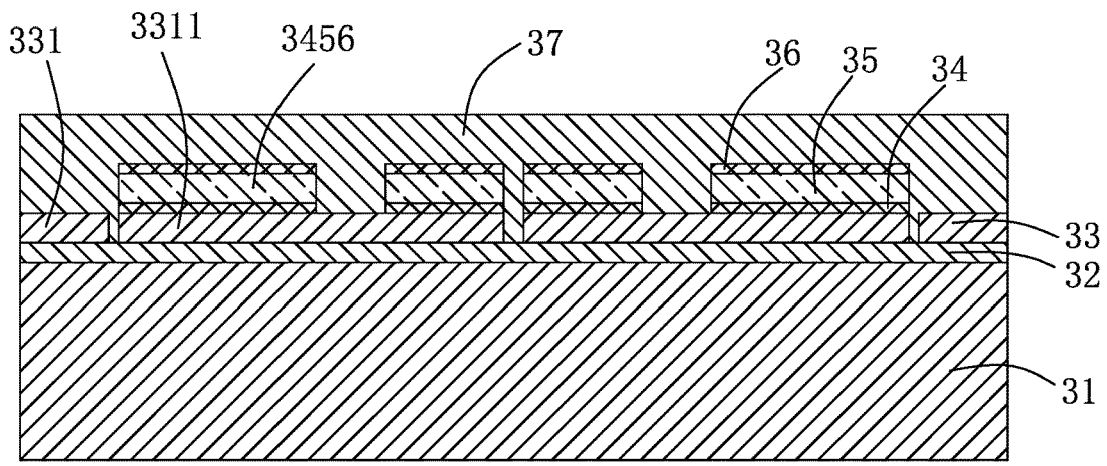
Figure 16:
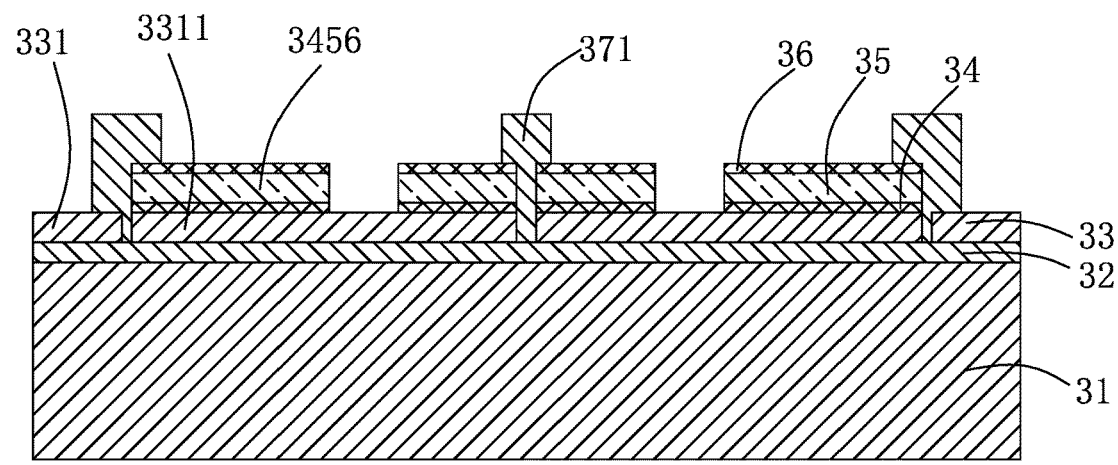
Figure 17:
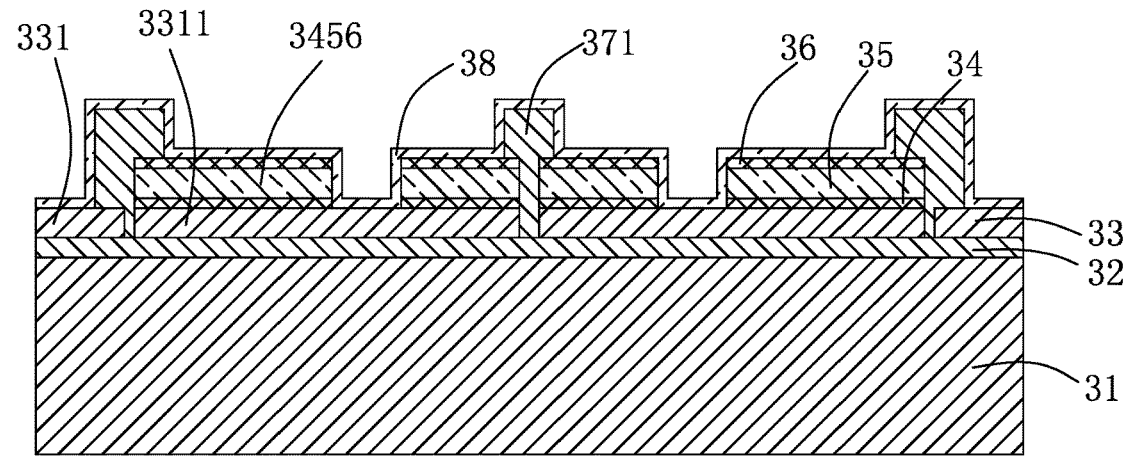
Figure 18:
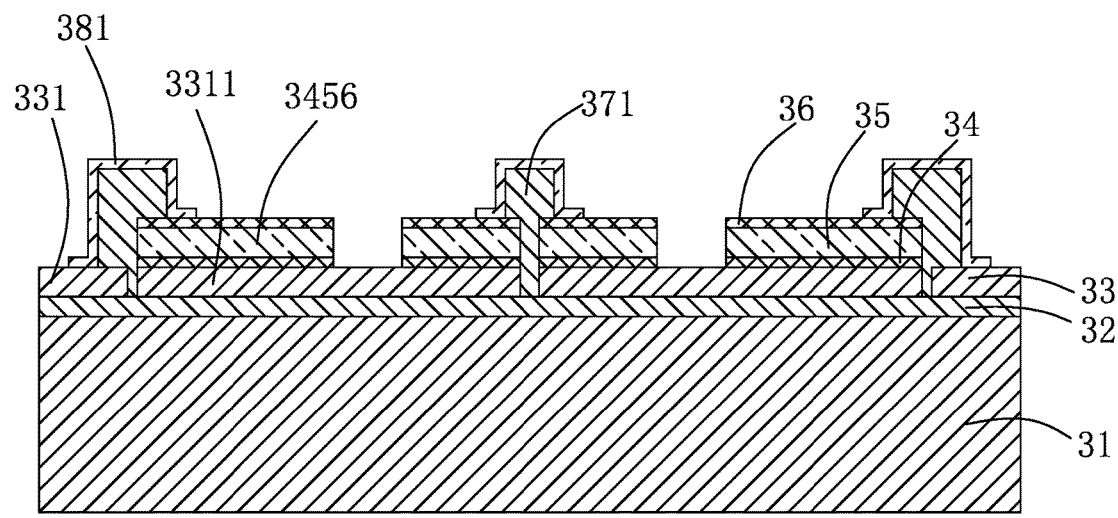
Figure 19:
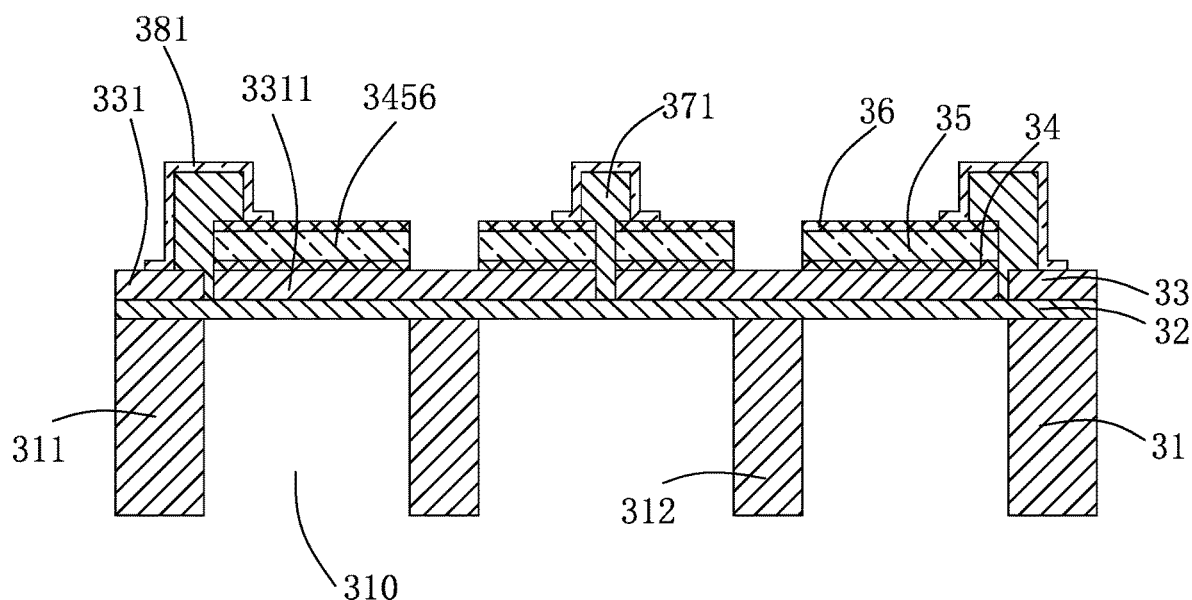
Figure 20:
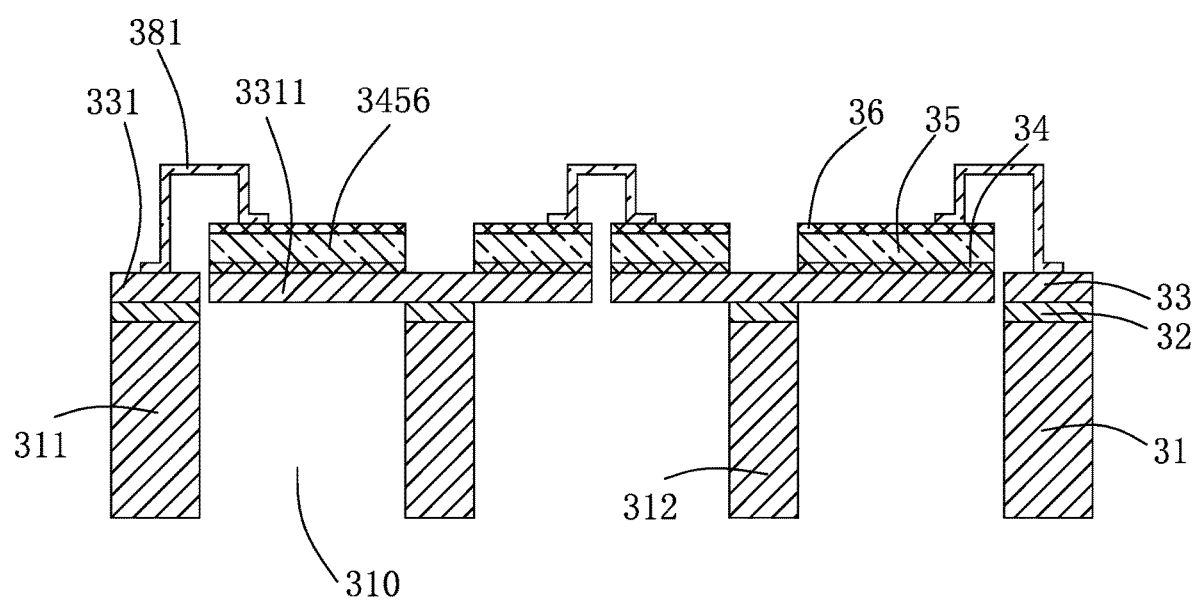

As shown in FIGS. 9-20, the method for manufacturing MEMS speaker provided by the present invention includes the following steps:

As shown in FIG. 9, a soi wafer is provided, and the soi wafer includes a first silicon layer 31, a silicon oxide layer 32, and a second silicon layer 33 that are sequentially stacked;

As shown in FIG. 10, a first electrode layer 34 is deposited on the second silicon layer 33;

As shown in FIG. 11, a piezoelectric material layer 35 is deposited on the first electrode layer 34;

As shown in FIG. 12, a second electrode layer 36 is deposited on the piezoelectric material layer 35;

As shown in FIG. 13, the second electrode layer 36, the piezoelectric material layer 35, and the first electrode layer 34 are etched to form a piezoelectric driver structure 3456;

As shown in FIG. 14, the second silicon layer 33 is etched to form a structural layer 331, and the structural layer 331 includes a cantilever beam structure 3311 corresponding to the piezoelectric driver structure 3456 one-to-one;

As shown in FIG. 15, a sacrificial layer 37 is deposited on the structural layer 331 and the piezoelectric driver structure 3456;

As shown in FIG. 16, the sacrificial layer 37 is etched, and the remaining sacrificial layer 371 is used to shape the subsequently formed flexible diaphragm;

As shown in FIG. 17, an flexible diaphragm 38 is deposited on the structural layer 331, the piezoelectric driver structure 3456 and the remaining sacrificial layer 371;

As shown in FIG. 18, the flexible diaphragm 38 is etched to form an flexible diaphragm 381;

As shown in FIG. 19, the first silicon layer 31 is etched to form a substrate sidewall 311 and a bracket 312, the substrate sidewall 311 surrounds a cavity 310, and the bracket 312 is disposed in the cavity 310;

As shown in FIG. 20, the silicon oxide layer 32 and the remaining sacrificial layer 371 are released.

It should be noted that, from a structural point of view, in addition to the remaining part etched by the first silicon layer, the substrate sidewall may also include a silicon oxide layer and the part corresponding to the second silicon layer. In addition to the remaining part etched by the first silicon layer, the bracket can also include the part corresponding to the silicon oxide layer. The corresponding part of the second silicon layer forms a cantilever beam structure (free end) and is fixed to the fixed end of the bracket.

The flexible diaphragm formed by the above method can have non-planar shapes such as arches, trapezoids, squares, and broken lines. When the flexible diaphragm is flat, the steps shown in FIG. 15 and FIG. 16 above can be omitted. Deposit a flexible diaphragm directly on the structural layer and the piezoelectric driver structure.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS speaker, comprising:
   a substrate sidewall comprising a first surface and a second surface that are set opposite to each other;
   a cavity surrounded by the substrate sidewall;
   a ring bracket accommodated in the cavity;
   a sounding assembly locating on the first surface of the substrate sidewall and sealing an opening of the cavity on the first surface, comprising a first sounding assembly locating between the substrate sidewall and the ring bracket, and a second sounding assembly inside the ring bracket;
   wherein
   the first sounding assembly includes a plurality of first driving parts each having a first fixed end fixed to the ring bracket, and a first free end connected to the first fixed end and extending in a direction close to the substrate sidewall;
   a first gap is formed between the first free end and the substrate sidewall;
   a second gap is formed between the first free ends of two adjacent first driving parts;
   the first sounding assembly further includes a first flexible diaphragm connecting the substrate sidewall and the first free end and sealing the first gap, a second flexible diaphragm connecting the first free ends of the two adjacent first driving parts and sealing the second gap;
   the second sounding assembly includes a plurality of second driving parts each having a second fixed end fixed to the ring bracket, and a second free end connected to the second fixed end extending away from the substrate sidewall;
   a third gap is formed between the second free ends of two adjacent second driving parts;
   the second sounding assembly further includes a third flexible diaphragm connecting second free ends of two adjacent second driving parts and sealing the third gap,
   the first flexible diaphragm has an arch shape arching away from the first gap, the second flexible diaphragm has an arch shape arching away from the second gap, the third flexible diaphragm has an arch shape arching away from the third gap.

2. The MEMS speaker as described in claim 1, wherein, the first flexible diaphragm and the second flexible diaphragm are integrated formed.

3. The MEMS speaker as described in claim 1 further comprising a connection wall in the cavity for connecting the substrate sidewall and the ring bracket; the connection wall is aligned with the second gap.

4. The MEMS speaker as described in claim 1, wherein, a stiffness of the first driving part is greater than a stiffness of the first flexible diaphragm; the stiffness of the first driving part is greater than a stiffness of the second flexible diaphragm; the stiffness of the second driving part is greater than a stiffness of the third flexible diaphragm.

5. The MEMS speaker as described in claim 1, wherein, the first driving part and/or the second driving part include a cantilever beam and a piezoelectric driver attached to the cantilever beam.

* * * * *